United States Patent [19]

Barnett

[11] Patent Number: 5,920,729
[45] Date of Patent: Jul. 6, 1999

[54] APPARATUS FOR PROVIDING PAIR OF COMPLEMENTARY OUTPUTS WITH FIRST AND SUBCIRCUITS TO CONVERT NON-COMPLEMENTARY AND COMPLEMENTARY INPUTS TO FIRST AND SECOND PAIR OF COMPLEMENTARY OUTPUT

[75] Inventor: Raymond E. Barnett, Burnsville, Minn.

[73] Assignee: VTC Inc., Bloomington, Minn.

[21] Appl. No.: 08/643,119

[22] Filed: Apr. 30, 1996

[51] Int. Cl.⁶ .................................................. G06F 3/00
[52] U.S. Cl. .............................................. 395/827; 326/64
[58] Field of Search .............................. 395/821; 326/60, 326/70

[56] References Cited

U.S. PATENT DOCUMENTS

| | | | |
|---|---|---|---|
| 4,625,129 | 11/1986 | Ueno | 379/324 |
| 4,931,673 | 6/1990 | Naghshineh | 307/475 |
| 4,943,743 | 7/1990 | Pelley, III et al. | 307/475 |
| 5,025,180 | 6/1991 | Xim et al. | 307/475 |
| 5,036,225 | 7/1991 | Matsumoto | 307/475 |
| 5,103,121 | 4/1992 | Wendell et al. | 307/475 |
| 5,105,106 | 4/1992 | Barre | 307/475 |
| 5,132,573 | 7/1992 | Tsuru et al. | 326/67 |
| 5,250,856 | 10/1993 | Burton et al. | 326/110 |
| 5,300,833 | 4/1994 | Oguri | 326/68 |
| 5,331,219 | 7/1994 | Nakamura | 307/475 |
| 5,332,935 | 7/1994 | Shyu | 326/71 |
| 5,343,094 | 8/1994 | Nguyen | 326/63 |
| 5,404,056 | 4/1995 | Maeda | 326/84 |
| 5,428,305 | 6/1995 | Wong et al. | 326/75 |
| 5,463,329 | 10/1995 | Kawasaki et al. | 326/77 |

*Primary Examiner*—Thomas C. Lee
*Assistant Examiner*—Anderson I. Chen
*Attorney, Agent, or Firm*—Kinney & Lange, P.A.

[57] ABSTRACT

A write driver, having a pair of inputs for receiving write data signals, includes a TTL buffer circuit connected to one input and a PECL buffer circuit connected to both inputs. A detector, responsive to a voltage at one of the inputs, selectively operates either the TTL buffer circuit or the PECL buffer circuit. The detector preferably comprises a comparator, a switching circuit, and two current mirrors. The comparator compares the voltage at one of the inputs to a reference voltage and outputs a signal controlling the switching circuit. The switching circuit enables one of the current mirrors, thereby enabling either the TTL or the PECL buffer circuit. In the preferred embodiment, a Schottky diode isolates the TTL buffer circuit from the PECL buffer circuit.

19 Claims, 2 Drawing Sheets

APPARATUS FOR PROVIDING PAIR OF COMPLEMENTARY OUTPUTS WITH FIRST AND SUBCIRCUITS TO CONVERT NON-COMPLEMENTARY AND COMPLEMENTARY INPUTS TO FIRST AND SECOND PAIR OF COMPLEMENTARY OUTPUT

BACKGROUND OF THE INVENTION

The present invention pertains to digital input buffers for use in write drivers for magnetic transducers.

In the art of magnetic recording, magnetic transducers write binary data on a magnetic medium, such as a moving magnetic tape or disc. The magnetic transducers use inductive coils to generate magnetic fields, which form magnetic patterns on the medium. The generated magnetic fields are polarized according to the direction current conducts, or flows, through the coils. Thus, selectively reversing the current direction makes it possible to form, or write, oppositely polarized magnetic patterns representing the ones and zeros of the binary data.

Reversing the current direction entails use of a write driver. A typical write driver includes a set of forward switches for directing current in a forward direction and a set of reverse switches for directing current in a reverse, or opposite, direction. The forward and reverse switches react to a pair of complementary, or differential, write signals that alternately operate the forward and reverse switches, thereby reversing the current and generating the magnetic fields for writing the binary data.

The write signals that operate the forward and reverse switches typically originate from a controller which interfaces with the write driver. A controller typically provides either a single TTL-compatible signal or a pair of PECL-compatible signals. Standard TTL (transistor-transistor-logic) signals have a logic zero threshold of 0.8V and a logic one threshold of 2.0V, and standard PECL (positive or pseudo emitter-coupled-logic) signals have a logic zero threshold of 3.1 to 3.4V and a logic one threshold of 4 to 4.3V.

To electrically isolate the controller from the write driver and to match the write signals to the switches, the write driver includes either a TTL or a PECL input buffer. The TTL buffer converts the single TTL signal, output by the controller, to the complementary signals for operating the write driver's forward and reverse switches. The PECL buffer simply buffers, or transfers, the controller's PECL signals to the switches.

Because controllers output either TTL-compatible or PECL-compatible signals, manufacturers of write drivers typically offer two distinct lines, or styles, of write drivers: one with a TTL buffer and the other with a PECL buffer. To fabricate the two lines of write drivers manufacturers commonly form write drivers with all the elements for a PECL and a TTL input buffer. Then, during the final steps of fabrication, a TTL or PECL metal option (metallic connecting layer) is applied to connect the elements of either the TTL or the PECL input buffer.

Applying the separate metal options, however, increases manufacturing complexity and reduces the scale economies of producing mass quantities of integrated write drivers. Thus, there is a need for a single input buffer circuit that accepts both TTL and PECL inputs. Such a buffer would not only reduce the cost of manufacturing integrated write driver circuits, but also offer the design flexibility of a single write driver with two input options.

SUMMARY OF THE INVENTION

A write driver, with a pair of output terminals for coupling to a magnetic transducer, comprises a TTL buffer circuit, an ECL buffer circuit, a detector, and a pair of inputs for receiving write data signals. The TTL buffer circuit, connected to a first of the pair of inputs, converts write data signals at the first input to a first pair of complementary signals at a second pair of terminals. The ECL buffer circuit is connected to both inputs and provides a second pair of complementary signals at the second pair of terminals. The detector responds to write signals at one input to selectively operate the TTL buffer circuit or the ECL buffer circuit.

In one embodiment, the detector includes a comparator, a switching circuit, and two current mirrors. The comparator compares the voltage at one of the inputs to a reference voltage and outputs a signal that operates the switching circuit. Using the comparator output signal, the switching, or steering, circuit steers a current to one or the other of the two current mirrors. One of the mirrors enables the TTL buffer circuit, and the other enables the PECL buffer circuit. Other embodiments further include isolation means, such as a diode, coupled between the ECL buffer and the TTL buffer.

DETAILED DESCRIPTION OF THE PREFERRED EMBODIMENTS

Figure 1:
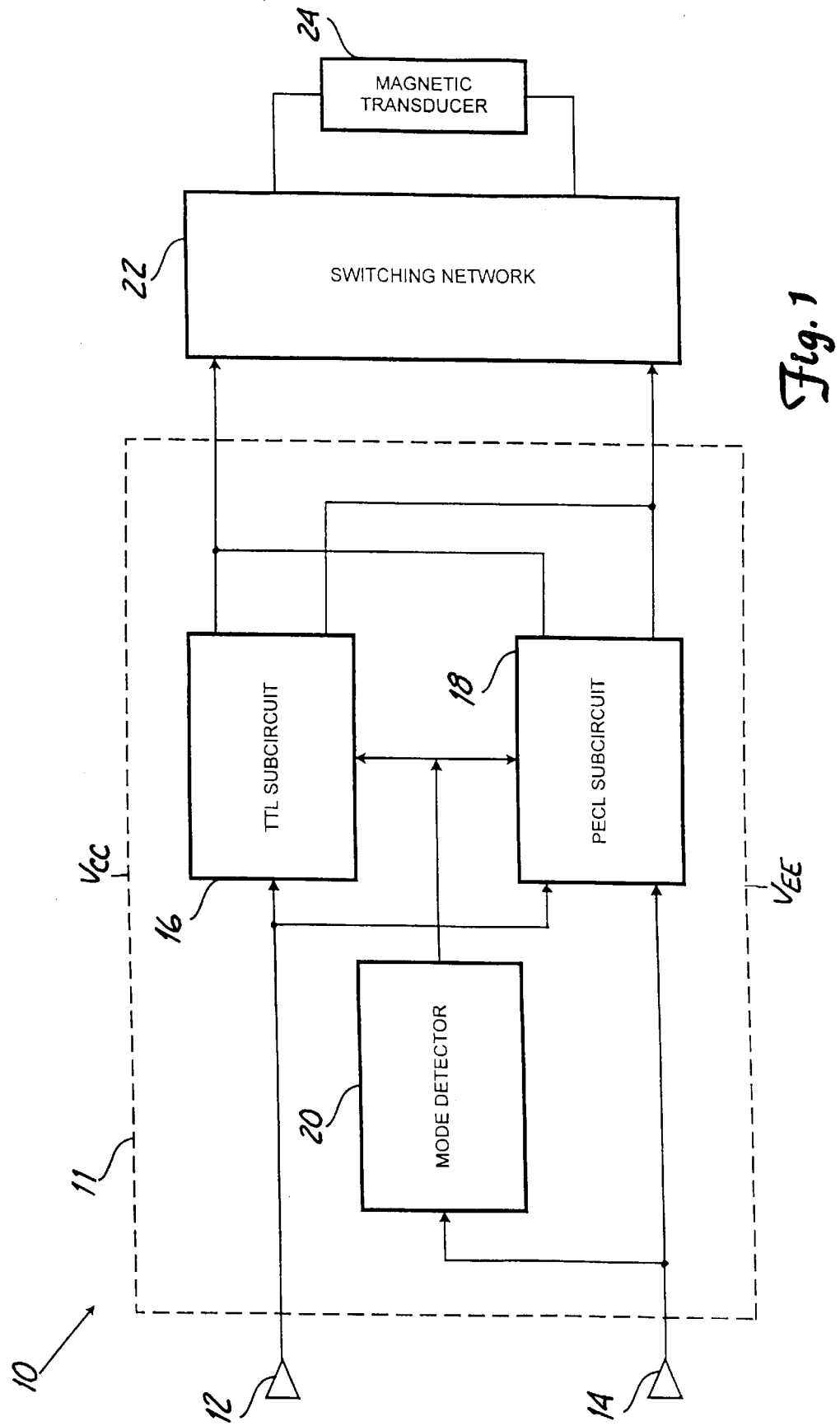
FIG. 1 is a block diagram of a write driver having an input buffer according to the present invention.

FIG. 1 shows write driver 10 coupled to magnetic transducer 24. The write driver comprises input buffer 11 for receiving write signals from a controller (not shown) and switching network 22 for operating the magnetic transducer. The write driver also includes supply terminals $V_{CC}$ and $V_{EE}$, preferably connected to a five-volt supply.

Input buffer 11 includes input terminals 12 and 14 for receiving one TTL or two PECL input signals. The buffer also includes TTL subcircuit 16 for converting a TTL-compatible signal to complementary signals, PECL subcircuit 18 for buffering PECL signals, and mode detector 20 for selecting the buffer mode of operation.

The input buffer has two modes of operation: a TTL mode and a PECL mode. Mode detector 20 monitors the voltage at input terminal 14 and selects one of the modes, based on a comparison to a preset threshold voltage. If the input voltage is less than the preset threshold, the detector selects the TTL mode by enabling the TTL subcircuit and disabling the PECL subcircuit. If, on the other hand, the voltage is greater than the threshold, the detector selects the PECL mode by enabling the PECL subcircuit and disabling the TTL subcircuit. When enabled, the TTL subcircuit converts the write signal at terminal 12, the designated TTL terminal, to complementary signals for operating switching network 22, and the PECL subcircuit buffers the complementary signals at terminals 12 and 14 to the switching network. In either case, the switching network operates the magnetic transducer.

Figure 2:
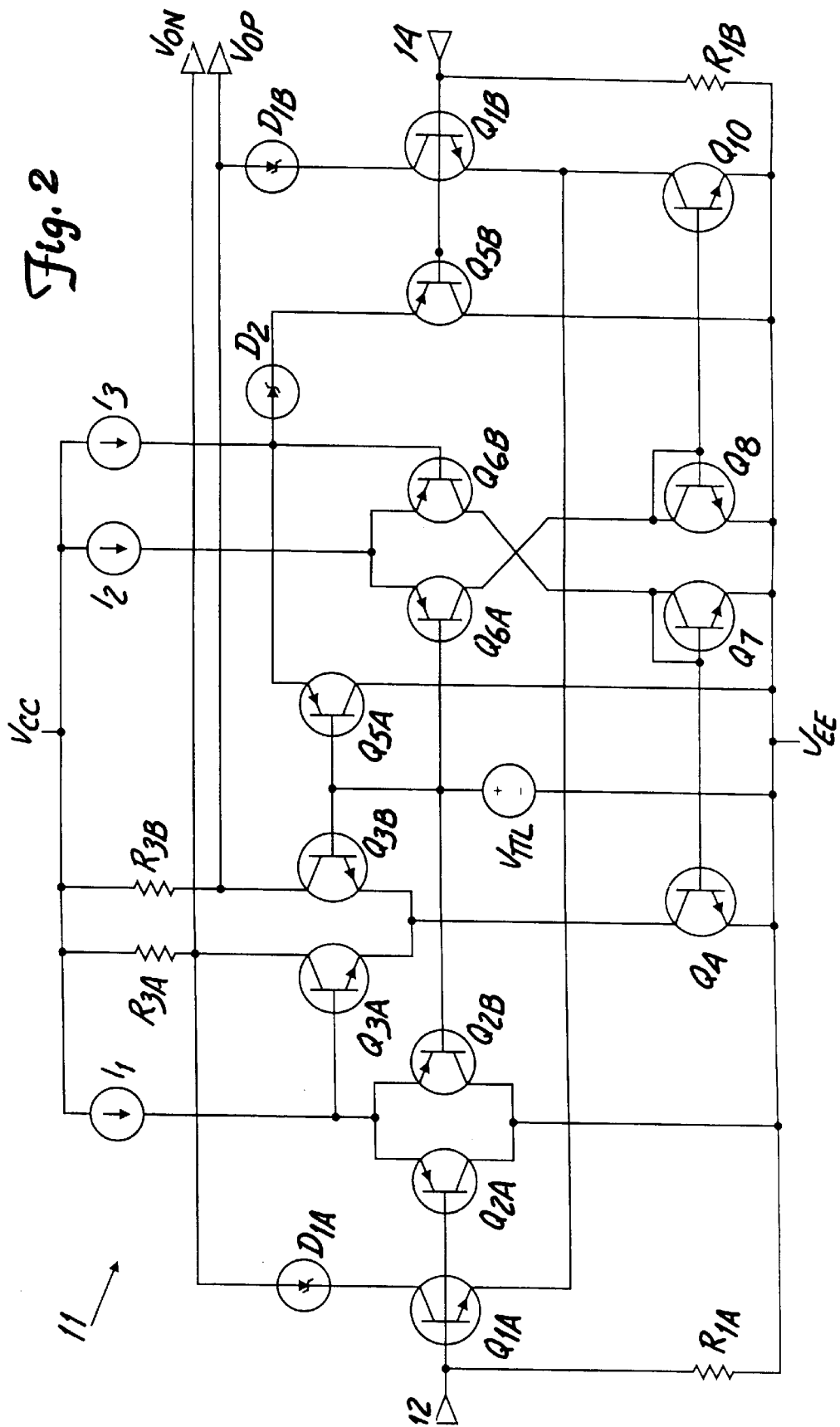
FIG. 2 is an electrical schematic showing the preferred embodiment of the input buffer.

FIG. 2, which shows the preferred embodiment of input buffer 11, illustrates the integrated circuit for PECL subcircuit 18, TTL subcircuit 16, and mode detector 20.

The PECL subcircuit includes differential transistor pair $Q_{1A}$–$Q_{1B}$ (shown on opposite sides of FIG. 2), Schottky diodes $D_{1A}$ and $D_{1B}$, resistors $R_{1A}$ and $R_{1B}$, and transistor $Q_{10}$. The $Q_{1A}$ and $Q_{1B}$ bases are connected to respective input terminals 12 and 14, and to terminal $V_{EE}$ via matched resistors $R_{1A}$ and $R_{1B}$. Resistors $R_{1A}$ and $R_{1B}$ are in the range of 50–100 kilo-ohms (KΩ). The $Q_{1A}$ and $Q_{1B}$ collectors are connected to supply terminal $V_{CC}$ via diodes $D_{1A}$ and $D_{1B}$ and resistors $R_{3A}$ and $R_{3B}$. The $Q_{1A}$ and $Q_{1B}$ emitters are connected to supply terminal $V_{EE}$ via transistor $Q_{10}$. Transistor $Q_{10}$ conducts current during the PECL mode, enabling differential pair $Q_{1A}$–$Q_{1B}$ to buffer the complementary signals at terminals 12 and 14 to output terminals $V_{ON}$ and $V_{OP}$. To shift to the TTL mode, the mode detector disables the PECL subcircuit by turning off transistor $Q_{10}$ and enables the TTL subcircuit.

The TTL subcircuit includes a differential level switch and a TTL-to-PECL converter. The level switch comprises pnp-type differential transistor pair $Q_{2A}$–$Q_{2B}$, current source $I_1$, and reference voltage $V_{TTL}$. The $Q_{2A}$ and $Q_{2B}$ collectors are connected to supply terminal $V_{EE}$, and the $Q_{2A}$ and $Q_{2B}$ emitters are connected to current source $I_1$ (which preferably supplies 50 micro-amps). The base, or control terminal, of transistor $Q_{2A}$ is coupled to terminal 12, and the base of transistor $Q_{2B}$ is coupled to reference voltage $V_{TTL}$, preferably a 2-volt source.

During the TTL mode, a voltage at terminal 12 less than voltage $V_{TTL}$ activates, or turns on, transistor $Q_{2A}$, forcing it to conduct current from source $I_1$ and thereby setting the $Q_{2A}$ emitter voltage to $V_{CC}$. Conversely, a voltage greater than voltage $V_{TTL}$ activates transistor $Q_{2B}$ and sets the $Q_{2B}$ emitter voltage to $V_{EE}+V_{TTL}+0.7V$. In either case, the emitter voltage drives the TTL-to-PECL converter comprising differential transistor pair $Q_{3A}$–$Q_{3B}$.

Transistor pair $Q_{3A}$–$Q_{3B}$ is an emitter-coupled pair connected to supply terminal $V_{CC}$ via matched resistors $R_{3A}$ and $R_{3B}$ and to supply terminal $V_{EE}$ via transistor $Q_4$. The $Q_{3A}$ base is coupled to the emitters of differential pair $Q_{2A}$–$Q_{2B}$, and the $Q_{3B}$ base is coupled to voltage $V_{TTL}$. Transistor $Q_4$ conducts current during the TTL mode, thereby enabling differential pair $Q_{3A}$–$Q_{3B}$ to convert the TTL signal at terminal 12 to complementary PECL signals at output terminals $V_{ON}$, $V_{OP}$.

More particularly, when the voltage at the $Q_{3A}$ base exceeds voltage $V_{TTL}$, transistor $Q_{3A}$ conducts the collector current of transistor $Q_4$, pulling down the voltage at output terminal $V_{ON}$ to $V_{CC}-I_{C3A}R_{3A}$, or $V_{CC}$ less the voltage drop across resistor $R_{3A}$. At the same time, transistor $Q_{3B}$ turns off, raising the voltage at output terminal $V_{OP}$ to $V_{CC}$. When the $Q_{3A}$ base voltage, or converter input, is less than voltage $V_{TTL}$, transistor $Q_{3B}$ conducts, thereby pulling down terminal $V_{OP}$ to $V_{CC}-I_{C3B}R_{3B}$ and pushing up terminal $V_{ON}$ to $V_{CC}$. In the preferred embodiment, the voltage drops across resistors $R_{3A}$ and $R_{3B}$ are set to 300 mV.

During the TTL mode, diode $D_{1A}$ isolates output terminal $V_{ON}$ from the base-to-collector pn junction of transistor $Q_{1A}$. TTL signals at terminal 12 are subject to transient overshoots (above supply voltage $V_{CC}$) which can forward bias, or turn on, this junction. Without the isolation of diode $D_{1A}$, the transient overshoots can turn on the junction and thus couple output terminal $V_{ON}$ to the input terminal, thereby disrupting the complementary relation between terminals $V_{ON}$ and $V_{OP}$. Thus, diode $D_{1A}$ ensures reliable operation of the TTL subcircuit by isolating the TTL-to-PECL converter from the PECL subcircuit, particularly the base-to-collector pn junction of transistor $Q_{1A}$. Diode $D_{1B}$, on the other hand, ensures symmetry between the $Q_{1A}$ and $Q_{1B}$ halves of the PECL subcircuit.

Mode detector 20, which selectively operates the PECL and TTL subcircuits, includes a comparator, a steering circuit, a TTL current mirror, and a PECL current mirror. The comparator compares the input voltage and terminal 14 to voltage $V_{TTL}$ and outputs a signal that operates the steering circuit. The steering, or switching, circuit selectively operates the TTL or PECL current mirror, thereby enabling either the TTL or the PECL subcircuit.

As shown in FIG. 2, the comparator comprises pnp-type differential transistor pair $Q_{5A}$–$Q_{5B}$, current source $I_3$, and Schottky diode $D_2$. The $Q_{5A}$ emitter is connected to supply terminal $V_{CC}$ via current source $I_3$ and to the $Q_{5B}$ emitter via diode $D_2$. Current source $I_3$ preferably supplies 50 µA. The collectors of transistor pair $Q_{5A}$–$Q_{5B}$ are connected to supply terminal $V_{EE}$. The $Q_{5A}$ and $Q_{5B}$ bases are connected respectively to reference voltage $V_{TTL}$ and to input terminal 14.

The voltage at terminal 14, the designated PECL terminal, operates transistors $Q_{5A}$ and $Q_{5B}$. When the voltage at terminal 14 ($V_{14}$) is greater than voltage ($V_{TTL}-V_{D2}$), transistor $Q_{5A}$ conducts and its emitter, which forms the comparator output, has a voltage approximately equal to supply voltage $V_{CC}$. In contrast, when $V_{14}$ is less than voltage ($V_{TTL}-V_{D2}$), transistor $Q_{5B}$ conducts, setting the comparator output voltage to $V_{14}+0.7V+V_{D2}$, or $V_{14}$ plus two diode drops. The comparator output is coupled to the base of transistor $Q_{6B}$, part of the steering circuit comprising differential transistor pair $Q_{6A}$–$Q_{6B}$.

The $Q_{6A}$ base is connected to reference voltage $V_{TTL}$. The $Q_{6A}$ and $Q_{6B}$ emitters are coupled to supply terminal $V_{CC}$ via current source $I_2$ (preferably 100 µA). The $Q_{6A}$ and $Q_{6B}$ collectors are respectively connected to the TTL current mirror and the PECL current mirror. The TTL and PECL mirrors preferably provide a 2-to-1 current gain and include respective transistors $Q_7$ and $Q_8$. Transistor $Q_7$ is coupled to transistor $Q_4$, the current source for the TTL-to-PECL converter, and transistor $Q_8$ is coupled to transistor $Q_{10}$, the current source for the PECL subcircuit.

Operating the buffer in the TTL mode entails coupling a TTL signal to terminal 12, the designated TTL terminal, and leaving terminal 14 uncoupled, or floating. Terminal 14, connected to the $Q_{5B}$ base and resistor $R_{1B}$, floats to $V_{EE}$ (which is less than voltage $V_{TTL}$), to turn on transistor $Q_{5B}$. Turning on transistor $Q_{5B}$ sets the comparator output (at the $Q_{5A}$ emitter) to $V_{EE}$ plus the voltage drops across transistor $Q_{5B}$ and diode $D_2$, or $V_{EE}+1.4V$, which is also less than $V_{TTL}$. A comparator output voltage less than voltage $V_{TTL}$ activates transistor $Q_{6B}$ (of the steering circuit), which then conducts the current of current source $I_2$ to transistor $Q_7$. Transistor $Q_7$ mirrors this $I_2$ source current to transistor $Q_4$, thereby enabling the TTL subcircuit ($Q_{3A}$–$Q_{3B}$) to convert the signal at terminal 12 to complementary signals at output terminals $V_{ON}$, $V_{OP}$.

Operating the buffer in the PECL mode requires coupling a pair of PECL signals to respective input terminals 12 and 14. Standard PECL signals have a logic zero of 3.1 to 3.4V and a logic one of 4 to 4.3V, both of which are greater than voltage $V_{TTL}$. The PECL signals therefore turn on transistor $Q_{5A}$ and maintain the comparator output at $V_{TTL}+0.7V$, or $V_{TTL}$ plus the voltage across the pn junction of transistor $Q_{5A}$. When the comparator output voltage is greater than voltage $V_{TTL}$, transistor $Q_{6A}$ conducts the $I_2$ source current to transistor $Q_8$, which in turn mirrors the current to transistor $Q_{10}$. Mirroring the current to transistor $Q_{10}$ disables the TTL subcircuit and enables the PECL subcircuit ($Q_{1A}$–$Q_{1B}$).

The present invention, therefore, provides a write driver with an intelligent buffer that accepts one TTL signal or two PECL signals, thereby avoiding the complexity and expense of fabricating two styles of write drivers. Important features of the buffer include a TTL subcircuit, a PECL subcircuit, and mode detector. An additional feature, such as a device for isolating the PECL subcircuit from the TTL subcircuit, is also desirable.

Although the present invention has been described with reference to preferred embodiments, those skilled in the art will recognize that changes may be made in form and detail without departing from the spirit and scope of the invention.

What is claimed is:

1. Apparatus for providing a pair of complementary output signals, comprising:

a first signal input for receiving either a non-complementary input signal or a first of a pair of complementary input signals;

a second signal input for receiving a second of the pair of complementary input signals;

a first subcircuit coupled to the first signal input and operable to convert the non-complementary input signal to a first pair of complementary output signals;

a second subcircuit coupled to the first and second inputs and operable to provide a second pair of complementary output signals based on the pair of complementary input signals, the second subcircuit including:

a differential transistor circuit including first and second transistors having respective first and second control terminals and pairs of controlled terminals, the first and second control terminals coupled to the respective first and second signal inputs for receiving the pair of complementary input signals; and isolation means coupled between the first transistor and the first subcircuit for isolating the first transistor from the first subcircuit when the first subcircuit is operating; and a detector coupled to one of the first and second signal inputs, the detector responsive to a signal at the one signal input for selectively operating the first or second subcircuit.

2. The apparatus of claim 1 wherein the isolation means is a diode.

3. The apparatus of claim 1 further including first and second resistors coupled between the respective first and second control terminals and a first supply terminal.

4. The apparatus of claim 1 wherein the detector includes:

a comparator having first and second comparator inputs and a comparator output, the first comparator input coupled to the second signal input, and the second comparator input coupled to a reference voltage; and a switching circuit coupled to the comparator output and responsive to the comparator to selectively enable either the conversion circuit or the buffer circuit.

5. The apparatus of claim 4 wherein the comparator comprises:

a third transistor having a control terminal and a pair of controlled terminals, the control terminal coupled to the second signal input;

a diode connected between a controlled terminal of the third transistor and the comparator output; and a fourth transistor having a control terminal and a pair of controlled terminals, the control terminal of the second transistor coupled to the reference voltage, and a controlled terminal of the second transistor coupled to the comparator output.

6. The apparatus of claim 5 wherein the first subcircuit includes:

a first differential transistor circuit including fifth and sixth transistors having respective first and second control terminals, the first control terminal coupled to the first signal input and the second control terminal coupled to a voltage source; and a second differential transistor circuit including seventh and eighth transistors having respective first and second control terminals, the first control terminal of the second transistor circuit connected to a controlled terminal of the fifth transistor, the second control terminal of the second transistor circuit connected to the voltage source, a controlled terminal of the seventh transistor connected to the detector.

7. Apparatus for providing a pair of complementary output signals, comprising:

a first signal input for receiving either a non-complementary input signal or a first of a pair of complementary input signals;

a second signal input for receiving a second of the pair of complementary input signals;

a first subcircuit coupled to the first signal input and operable to convert the non-complementary input signal to a first pair of complementary output signals;

a second subcircuit coupled to the first and second inputs and operable to provide a second pair of complementary output signals based on the pair of complementary input signals; and a detector coupled to one of the first and second signal inputs, the detector responsive to a signal at the one signal input for selectively operating the first or second subcircuit, the detector including a comparator having first and second comparator inputs and a comparator output, the first comparator input coupled to the second signal input, and the second comparator input coupled to a reference voltage, and a switching circuit coupled to the comparator output and responsive to the comparator to selectively enable either the conversion circuit or the buffer circuit.

8. The apparatus of claim 7 wherein the comparator comprises:

a third transistor having a control terminal and a pair of controlled terminals, the control terminal coupled to the second signal input;

a diode connected between a controlled terminal of the third transistor and the comparator output; and a fourth transistor having a control terminal and a pair of controlled terminals, the control terminal of the second transistor coupled to the reference voltage, and a first controlled terminal of the second transistor coupled to the comparator output.

9. The apparatus of claim 7 wherein the switching circuit includes first and second differentially-connected transistors, a control terminal of the first transistor connected to the comparator output and a control terminal of the second transistor connected to a voltage source.

10. The apparatus of claim 7 wherein the detector further includes:

a first current mirror coupled between the switching circuit and the first subcircuit; and a second current mirror coupled between the switching circuit and the second subcircuit.

11. Apparatus for providing a pair of complementary output signals, comprising:

a first signal input for receiving either a non-complementary input signal or a first of a pair of complementary input signals;

a second signal input for receiving a second of the pair of complementary input signals;

a first subcircuit coupled to the first signal input and operable to convert the non-complementary input signal to a first pair of complementary output signals;

a second subcircuit coupled to the first and second inputs and operable to provide a second pair of complementary output signals based on the pair of complementary input signals; and a detector coupled to one of the first and second signal inputs, the detector responsive to a signal at the one signal input for selectively operating the first or second subcircuit, wherein the first subcircuit includes:

a first differential transistor circuit including fifth and sixth transistors having respective first and second control terminals, the first control terminal coupled to the first signal input and the second control terminal coupled to a voltage source, and a second differential transistor circuit including seventh and eighth transistors having respective first and second control terminals, the first control terminal of the second transistor circuit connected to a controlled terminal of the fifth transistor, the second control terminal of the second transistor circuit connected to the voltage source, and a controlled terminal of the seventh transistor connected to the detector.

12. Apparatus for providing a pair of complementary output signals, comprising:

a first signal input for receiving either a non-complementary input signal or a first of a pair of complementary input signals;

a second signal input for receiving a second of the pair of complementary input signals;

a first subcircuit coupled to the first signal input and operable to convert the non-complementary input signal to a first pair of complementary output signals;

a second subcircuit coupled to the first and second inputs and operable to provide a second pair of complementary output signals based on the pair of complementary input signals;

a detector coupled to one of the first and second signal inputs, the detector responsive to a signal at the one signal input for selectively operating the first or second subcircuit; and a switching network having a pair of terminals for coupling to a magnetic transducer and being responsive to either the first or second pair of complementary output signals for controlling the magnetic transducer.

13. An input buffer comprising:

first and second inputs, the first input (12) for receiving either a non-complementary input signal or a first of a pair of complementary input signals, the second input (14) for receiving a second of the pair of complementary input signals;

a TTL buffer circuit including a first pair of differentially-connected transistors (3A, 3B), the first pair having a first transistor (3A) with a control terminal coupled to the first input (14) and a second transistor (3B) with a control terminal coupled to a reference voltage ($V_{TTL}$);

an ECL buffer circuit including a second pair of differentially-connected transistors (1A, 1B), the second pair having a third transistor (1A) with a control terminal coupled to the first input (12) and a fourth transistor (1B) with a control terminal coupled to the second input (14);

a detector circuit including third and fourth pairs of differentially-connected transistors, the third pair (5A, 5B) having a fifth transistor (5A) with a control terminal coupled to the reference voltage ($V_{TTL}$) and a sixth transistor (5B) with a control terminal coupled to one of the first and second inputs (12, 14), the fourth pair (6A, 6B) having a seventh transistor (6A) with a control terminal coupled to the reference voltage ($V_{TTL}$) and a controlled terminal coupled to a controlled terminal of the third transistor (1A), and the fourth pair having an eighth transistor (6B) with a control terminal coupled to a controlled terminal of the fifth transistor (5A) and the eighth transistor (6B) having a controlled terminal coupled to a controlled terminal of the first transistor (3A).

14. The buffer of claim 13 further including:

a first diode (D1A) coupled between a controlled terminal of the third transistor (1A) and a controlled terminal of the first transistor (3A).

15. The buffer of claim 13 further including:

a first current mirror coupled between a controlled terminal of the seventh transistor (6A) and a controlled terminal of the third transistor (1A); and a second current mirror coupled between a controlled terminal of the eighth transistor (6B) and a controlled terminal of the first transistor (3A).

16. A write driver having a pair of output terminals for coupling to a magnetic transducer, the write driver comprising:

first and second signal inputs for receiving write data signals;

a TTL buffer circuit connected to the first signal input and to a second pair of terminals, for converting write data signals at the first signal input to a first pair of complementary signals at the second pair of terminals;

an ECL buffer circuit connected to the first and second signal inputs and the second pair of terminals, for providing a second pair of complementary signals at the second pair of terminals;

a detector connected to the TTL buffer circuit, the ECL buffer circuit, and one of the first and second signal inputs, the detector responsive to write signals at the one signal input to selectively operate the TTL buffer circuit or the ECL buffer circuit; and a switching network connected between the pair of second terminals and the pair of output terminals, the switching network responsive to complementary signals at the second pair of terminals for operating the magnetic transducer.

17. The write driver of claim 16 further including:

isolation means coupled between the ECL buffer circuit and one of the second pair of terminals for isolating the one of the second pair of terminals from the ECL buffer circuit.

18. The write driver of claim 11 wherein the detector includes:

a comparator having first and second comparator inputs and a comparator output, the first comparator input coupled to the one of the first and second signal inputs, and the second comparator input coupled to a reference voltage; and a switching circuit coupled to the comparator output and responsive to the comparator to selectively enable either the TTL buffer circuit or the ECL buffer circuit.

19. Apparatus for providing a pair of complementary output PECL signals, comprising:

a first signal input for receiving either a non-complementary input TTL signal or a first of a pair of complementary input PECL signals;

a second signal input for receive a second of the pair of complementary input PECL signals;

a first subcircuit coupled to the first signal input and operable to convert the non-complementary input TTL signal to a first pair of complementary output PECL signals;

a second subcircuit coupled to the first and second inputs and operable to provide a second pair of complementary output PECL signals based on the pair of complementary input PECL signals; and a detector coupled to one of the first and second signal inputs, the detector responsive to a signal at the one signal input for selectively operating the first or second subcircuit.

* * * * *